(12) United States Patent
Kasai et al.

(10) Patent No.: US 10,406,808 B2
(45) Date of Patent: Sep. 10, 2019

(54) PRINTING APPARATUS AND PRINTHEAD SUBSTRATE

(71) Applicant: CANON KABUSHIKI KAISHA, Tokyo (JP)

(72) Inventors: Ryo Kasai, Tokyo (JP); Kengo Umeda, Tokyo (JP); Takamitsu Tokuda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/009,433

(22) Filed: Jun. 15, 2018

(65) Prior Publication Data
US 2019/0001667 A1     Jan. 3, 2019

(30) Foreign Application Priority Data

Jun. 28, 2017  (JP) ................................ 2017-126518
May 24, 2018  (JP) ................................ 2018-099798

(51) Int. Cl.
| | |
|---|---|
| *B41J 2/045* | (2006.01) |
| *G01K 7/01* | (2006.01) |
| *B41J 2/14* | (2006.01) |
| *H01L 29/73* | (2006.01) |

(52) U.S. Cl.
CPC ......... *B41J 2/04563* (2013.01); *B41J 2/0458* (2013.01); *B41J 2/04541* (2013.01); *B41J 2/04586* (2013.01); *B41J 2/14153* (2013.01); *G01K 7/01* (2013.01); *B41J 2202/13* (2013.01); *B41J 2202/21* (2013.01); *H01L 29/7304* (2013.01)

(58) Field of Classification Search
CPC ............. B41J 2/045; G01K 7/00; H01L 29/73
See application file for complete search history.

(56) References Cited

U.S. PATENT DOCUMENTS

| | | |
|---|---|---|
| 8,400,484 B2 | 3/2013 | Furukawa et al. |
| 8,508,565 B2 | 8/2013 | Furukawa et al. |
| 9,096,058 B2 | 8/2015 | Furukawa et al. |

FOREIGN PATENT DOCUMENTS

JP        2012-954 A        1/2012

OTHER PUBLICATIONS ip.com search (Year: 2019).*
ip.com search2 (Year: 2019).*

* cited by examiner

*Primary Examiner* — Lisa Solomon
(74) *Attorney, Agent, or Firm* — Venable LLP

(57) ABSTRACT

A printing apparatus, comprises: a printhead substrate; an application circuit for applying a driving signal to the driving element; a ground line connected to the application circuit; a plurality of temperature sensors that detects temperature relate to the printhead substrate, wherein the cathode side of the plurality of temperature sensors connects the ground line via a resistance; a first selection circuit, on an anode side of the plurality of temperature sensors, that selects one temperature sensor; a second selection circuit, on the cathode side of the plurality of temperature sensor, that selects the one temperature sensor; and a temperature signal output circuit that outputs a temperature signal in accordance with a difference between a voltage of an anode side and a voltage of a cathode side of the selected temperature sensor.

18 Claims, 12 Drawing Sheets

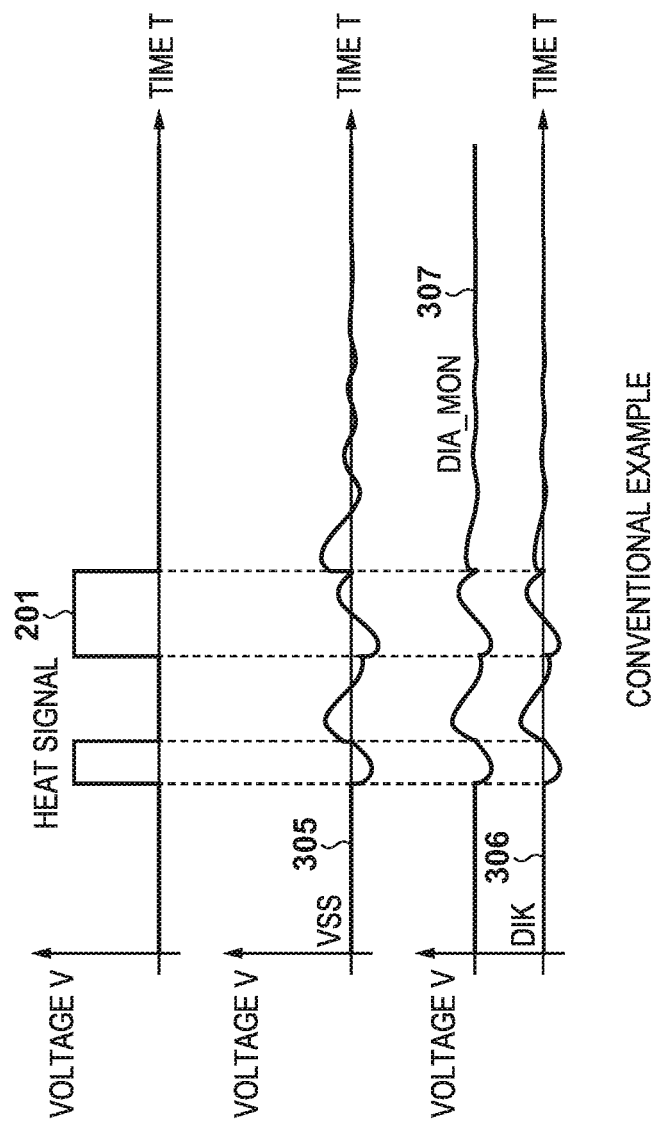

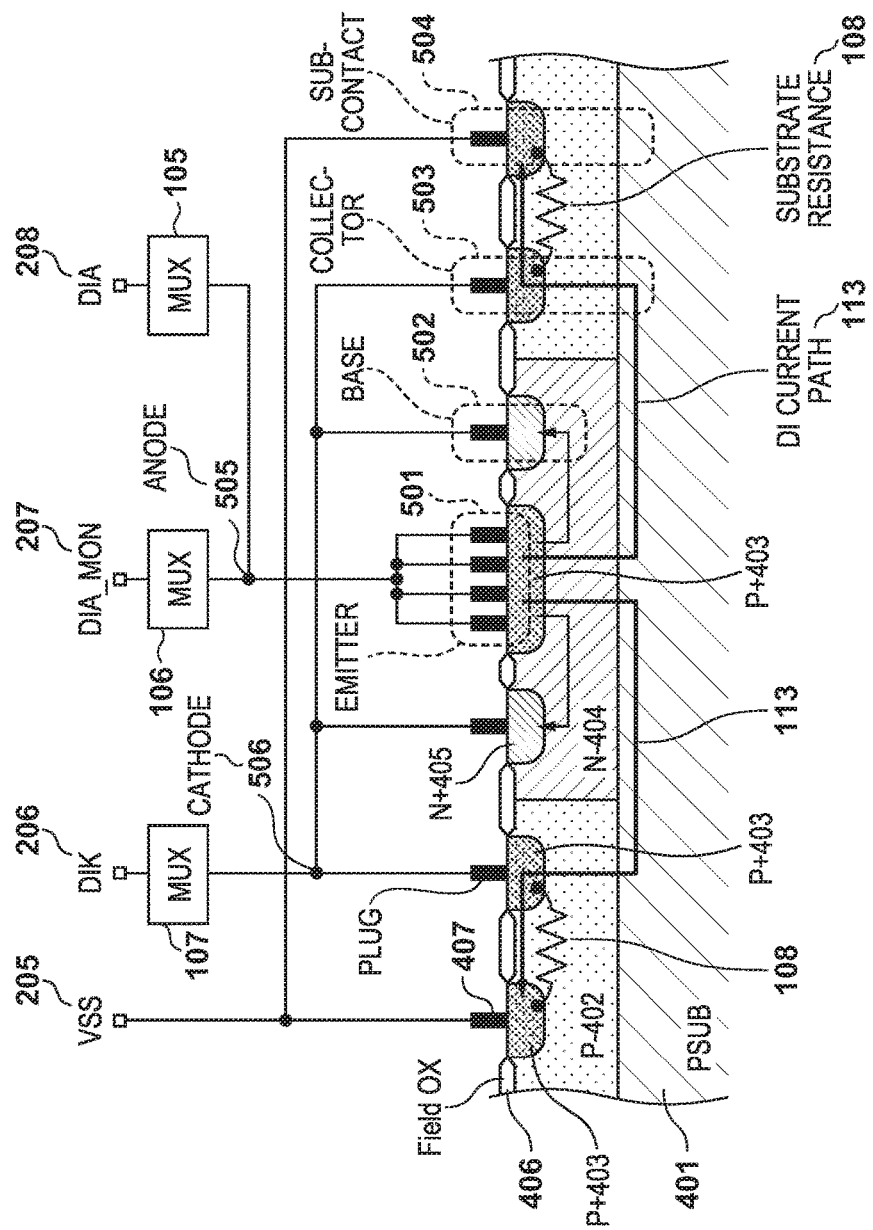

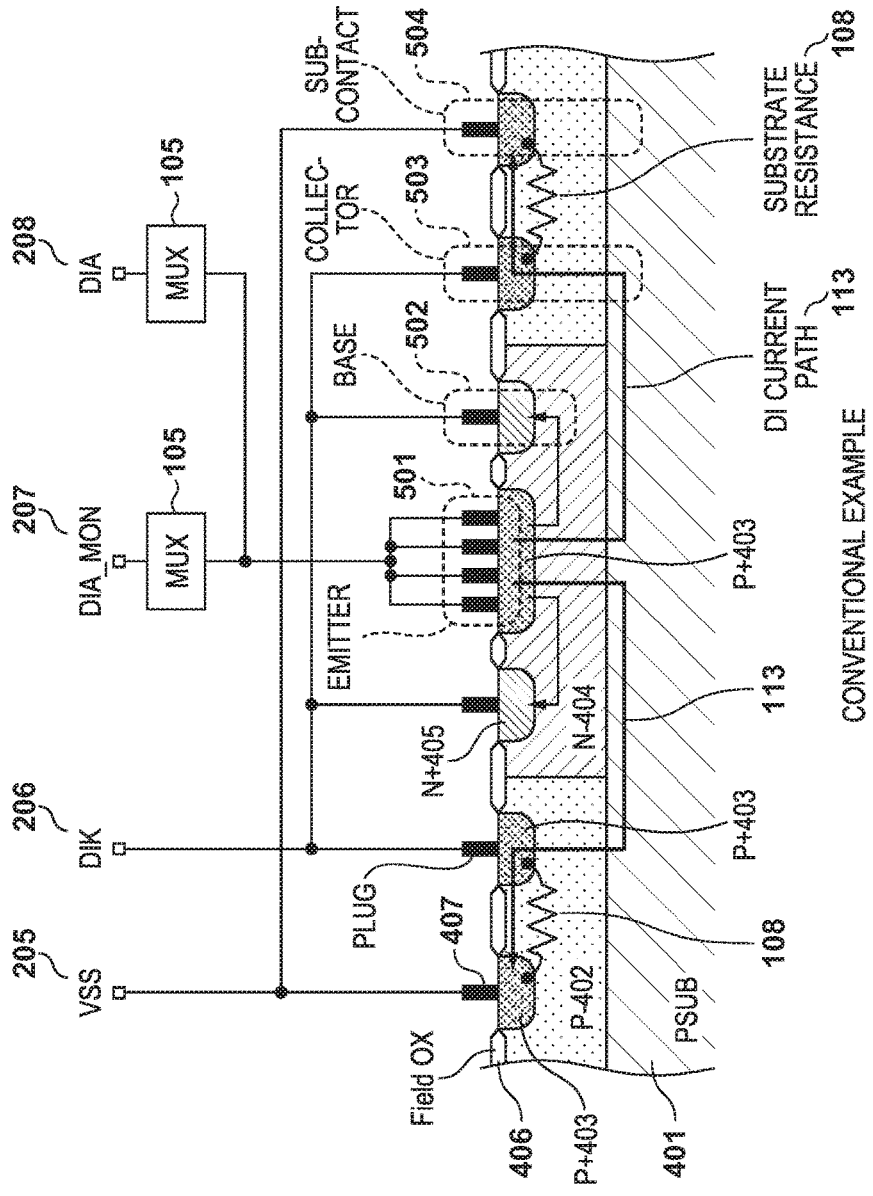

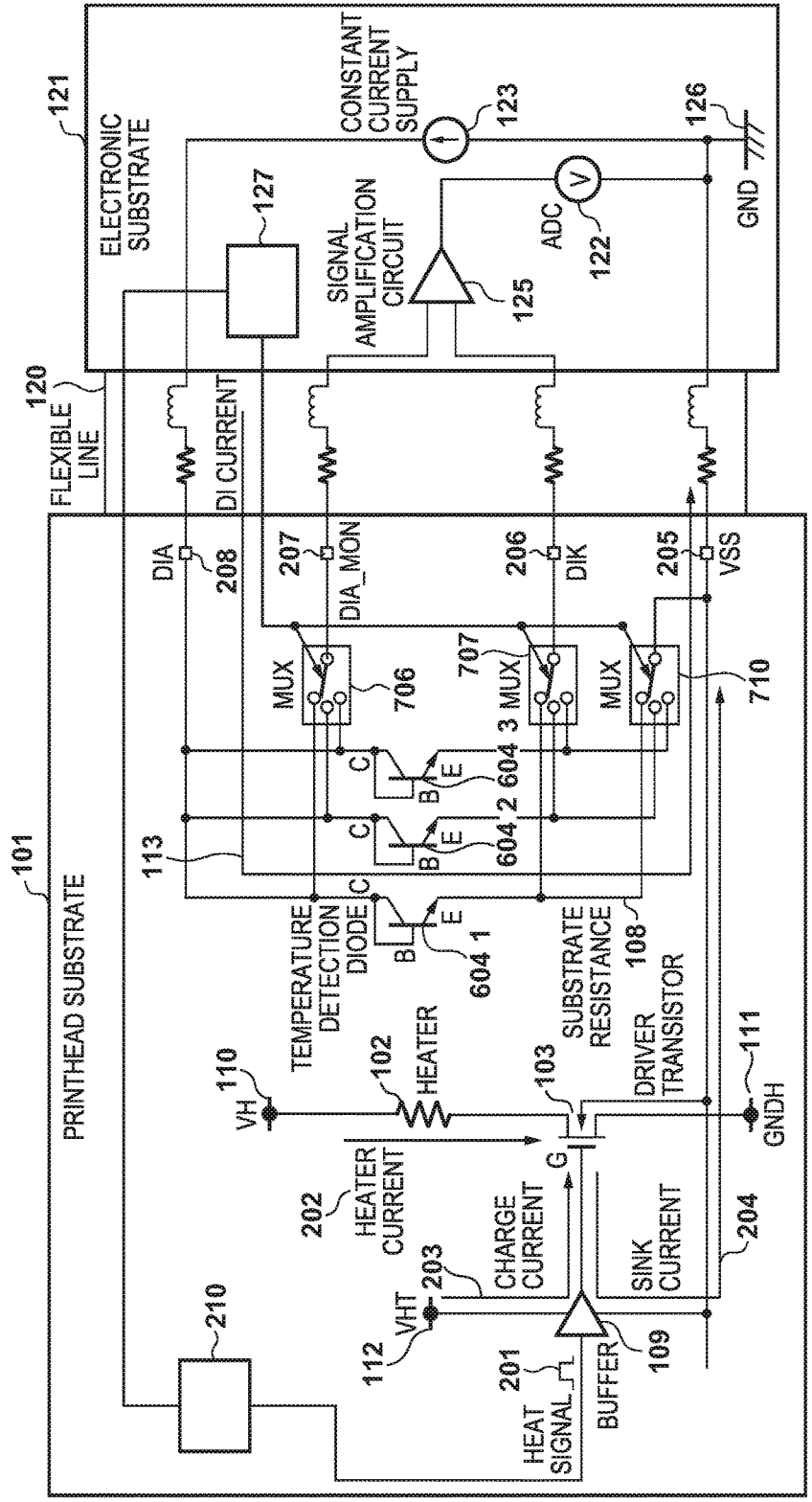

PRINTING APPARATUS AND PRINTHEAD SUBSTRATE

BACKGROUND OF THE INVENTION

Field of the Invention

The present invention relates to a printing apparatus and printhead substrate.

Description of the Related Art

A printing apparatus for printing information such as desired text or images onto a print medium of a sheet type such as paper or film is widely used in general. As a configuration of a printhead used by such a printing apparatus, there are ink-jet type printheads that use thermal energy to print. An ink-jet type printhead prints by having heaters arranged as a printing element in portions joining discharge ports at which ink droplets are discharged, and applying a current to the heaters to generate heat causing an ink droplet to be discharged due to film boiling of the ink. Such a printhead has a large number of discharge ports, and it is easy to arrange heaters at a high density, and by this it is possible to obtain a higher definition printed image.

In a printhead substrate, a number of droplets of discharged ink and a discharge speed vary in accordance with temperature. For this reason, in cases where a temperature distribution arises in the substrate, this temperature distribution will result in image irregularities, and image quality will decrease.

Accordingly, in order to correct temperature irregularities of the substrate, the temperatures of multiple points within the substrate are obtained and temperature control is performed such that the temperature within the substrate is uniform. Japanese Patent Laid-Open No. 2012-000954 discloses, arranging a selection circuit within the substrate and a circuit configuration by which the temperatures of multiple points can be obtained using a minimal number of terminals, in order to obtain the temperatures of multiple points. By such a configuration, it is possible to correct temperature irregularities of multiple points at a lower cost and realize improvements in image quality. However, the number of simultaneously driven heaters for ink discharge has increased in accordance with further improvements in the throughput of printing operation using printhead substrates (printheads) in recent years, and it has become difficult to obtain the temperatures of multiple points with high precision due to noise thereof. There is a possibility that a similar problem will arise even in cases where a single heater is driven.

SUMMARY OF THE INVENTION

According to one aspect of the present invention, there is provided a printing apparatus, comprising: a printhead substrate comprising a print element; a driving element for driving the printing element; an application circuit for applying a driving signal to the driving element; a ground line connected to the application circuit; a plurality of temperature sensors configured to detect temperature relate to the printhead substrate, wherein the cathode side of the plurality of temperature sensors connects the ground line via a resistance; a first selection circuit, on an anode side of the plurality of temperature sensors, configured to select one of the plurality of temperature sensors; a second selection circuit, on the cathode side of the plurality of temperature sensors, configured to select one of the plurality of temperature sensors; and a temperature signal output circuit configured to output a temperature signal in accordance with a difference between a voltage of an anode side of the temperature sensor selected by the first selection circuit and a voltage of a cathode side of the temperature sensor selected by the second selection circuit.

According to another aspect of the present invention, there is provided a printhead substrate, comprising: a printing element; a driving element for driving the printing element; an application circuit for applying a driving signal to the driving element; a ground line connected to the application circuit; a plurality of temperature sensors arranged in the printhead substrate, wherein a cathode side of the plurality of temperature sensors connects the ground line via a resistance; a first selection circuit, on an anode side of the plurality of temperature sensors, configured to select one of the plurality of temperature sensors; a second selection circuit, on a cathode side of the plurality of temperature sensors, configured to select one of the plurality of temperature sensors; and an output circuit configured to output a voltage of an anode side of temperature sensor selected by the first selection circuit and a voltage of a cathode side of temperature sensor selected by the second selection circuit.

By the present invention, it becomes possible to suppress an influence of noise when detecting temperatures of multiple points within a printhead.

Further features of the present invention will become apparent from the following description of exemplary embodiments (with reference to the attached drawings).

BRIEF DESCRIPTION OF THE DRAWINGS

FIG. 4 is a view for describing voltage waveforms in a conventional circuit configuration for comparison.

FIGS. 5A and 5B are plane/cross-sectional views of a PNP temperature detection diode according to the first embodiment.

FIG. 6 is a cross-sectional view of a conventional PNP temperature detection diode for comparison.

FIGS. 7A, 7B, and 7C are views illustrating an example of circuit configurations according to a second embodiment.

DESCRIPTION OF THE EMBODIMENTS

First Embodiment

Figure 1:
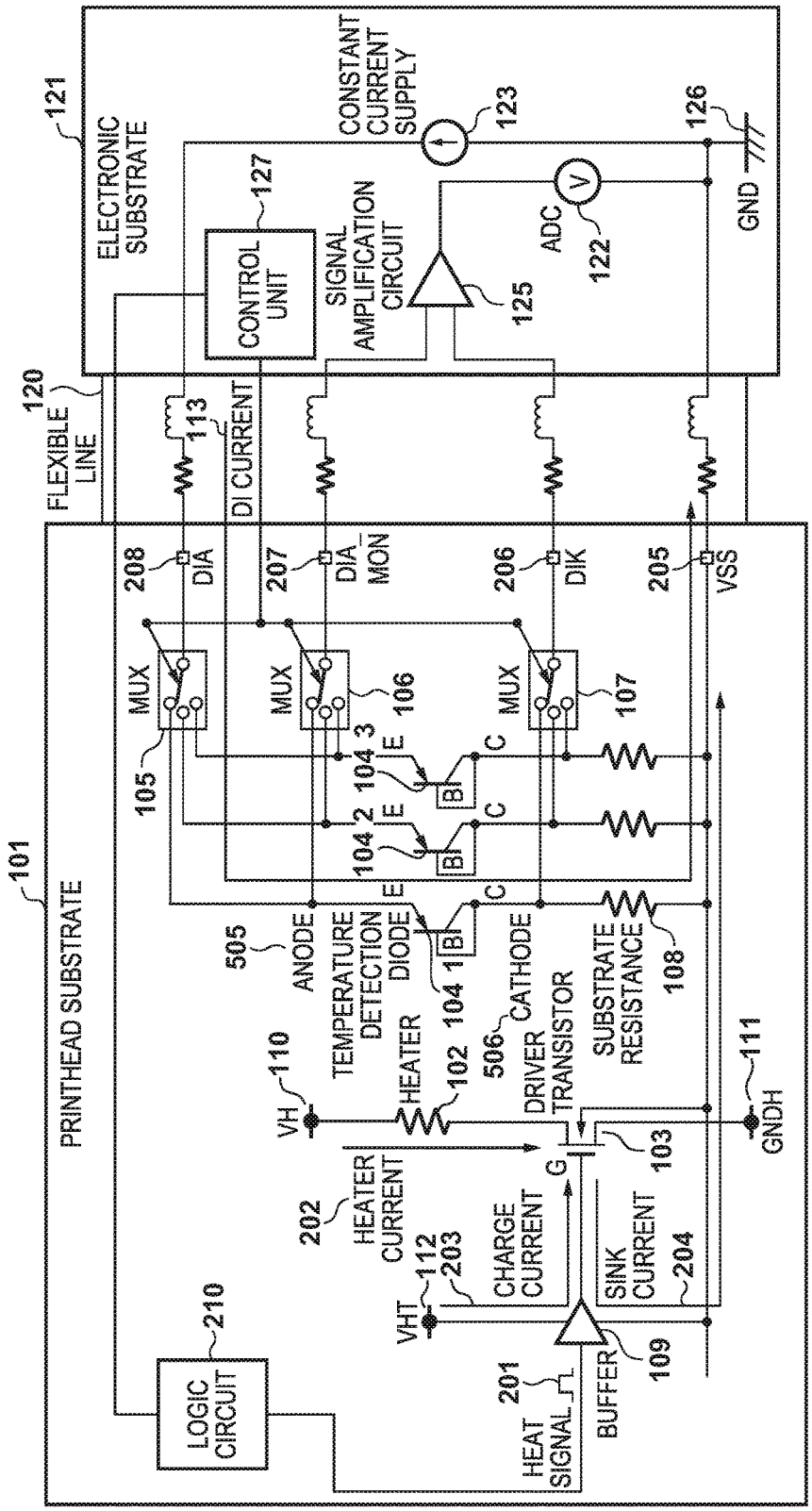
FIG. 1 is a view illustrating an example of a circuit configuration according to a first embodiment.
Figure 2:
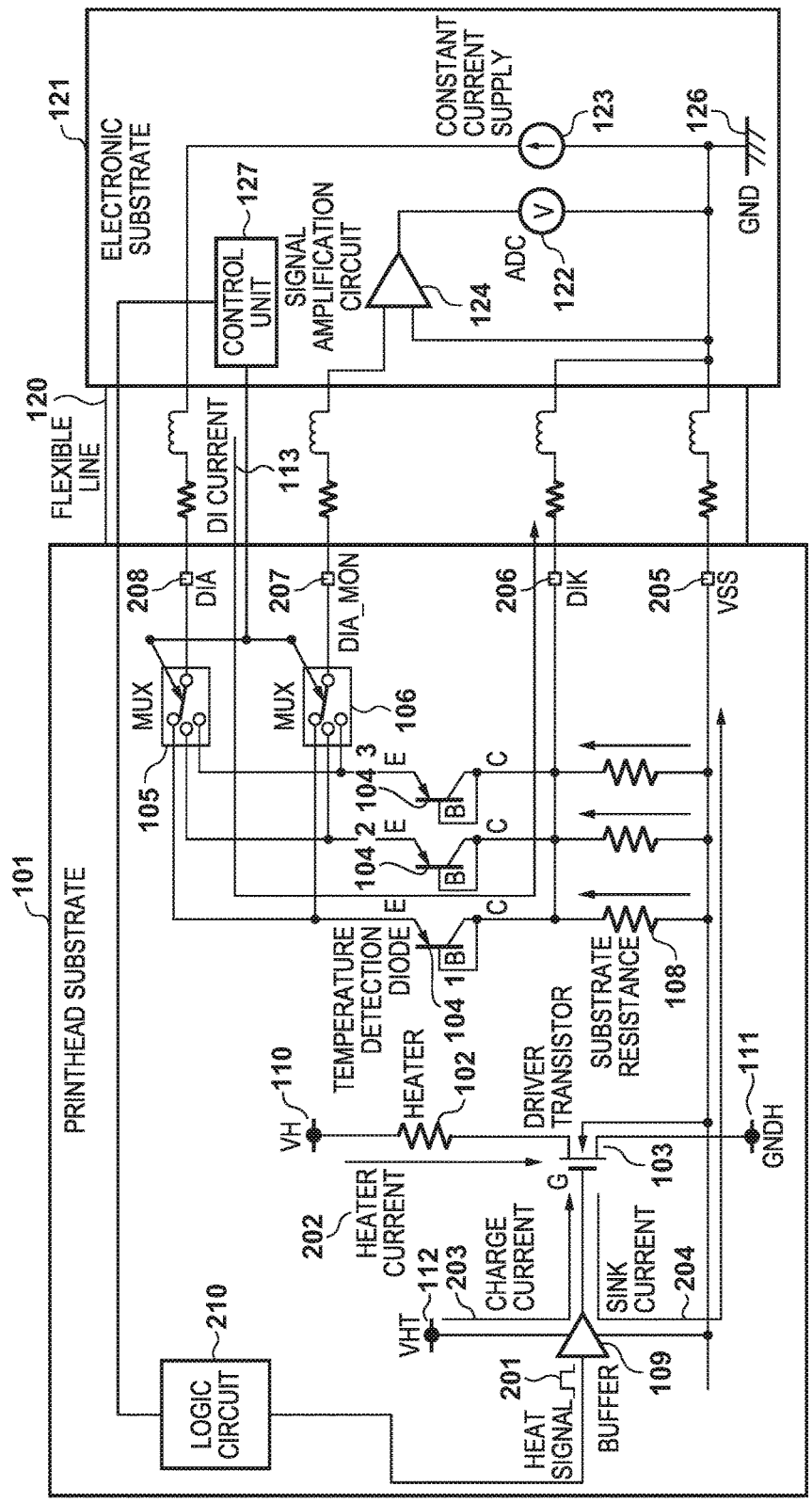
FIG. 2 is a view illustrating an example of a configuration of a conventional temperature detection circuit for comparison.
Figure 3:
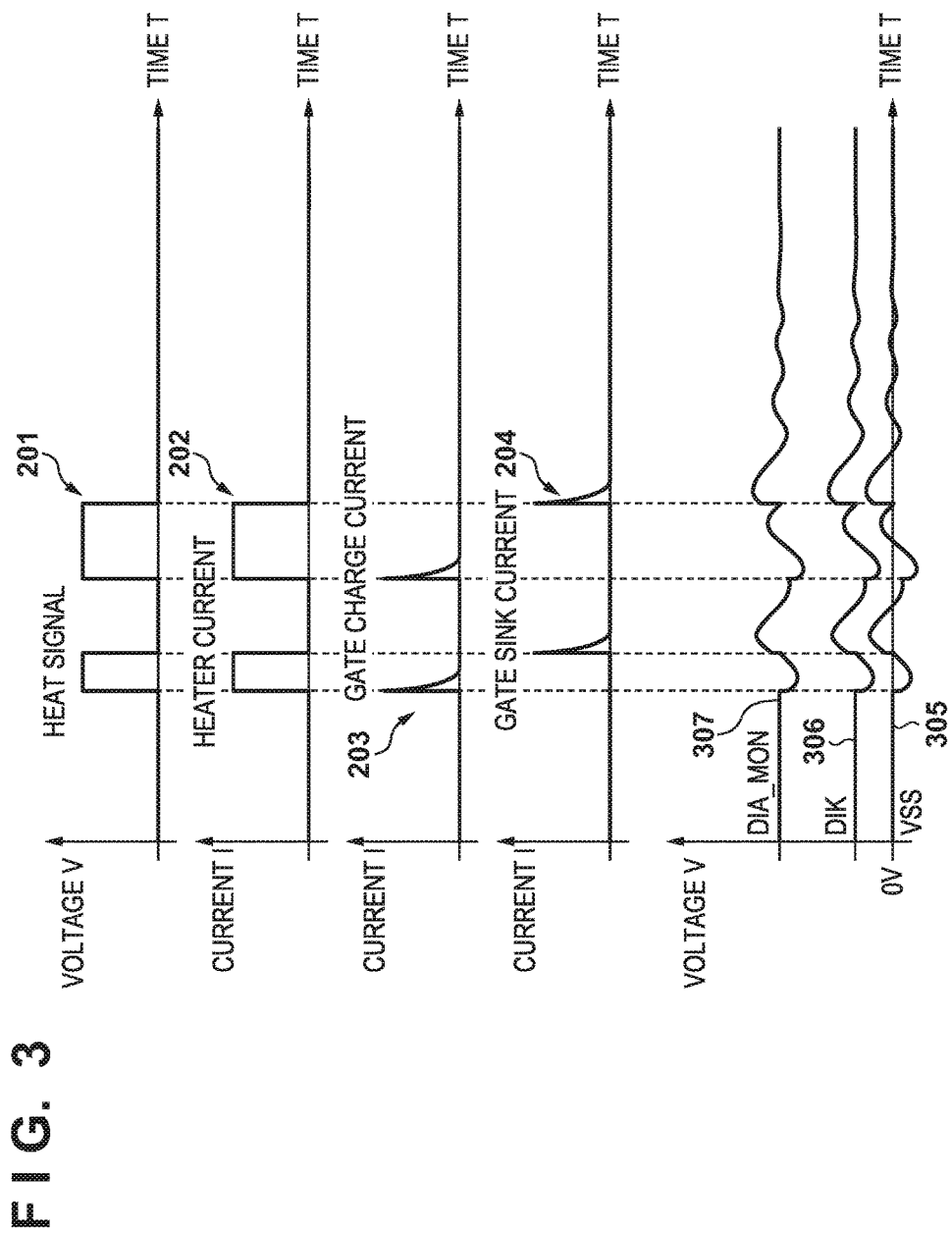
FIG. 3 is a view for describing voltage/current waveforms in the circuit configuration according to the first embodiment.
Figure 5A:
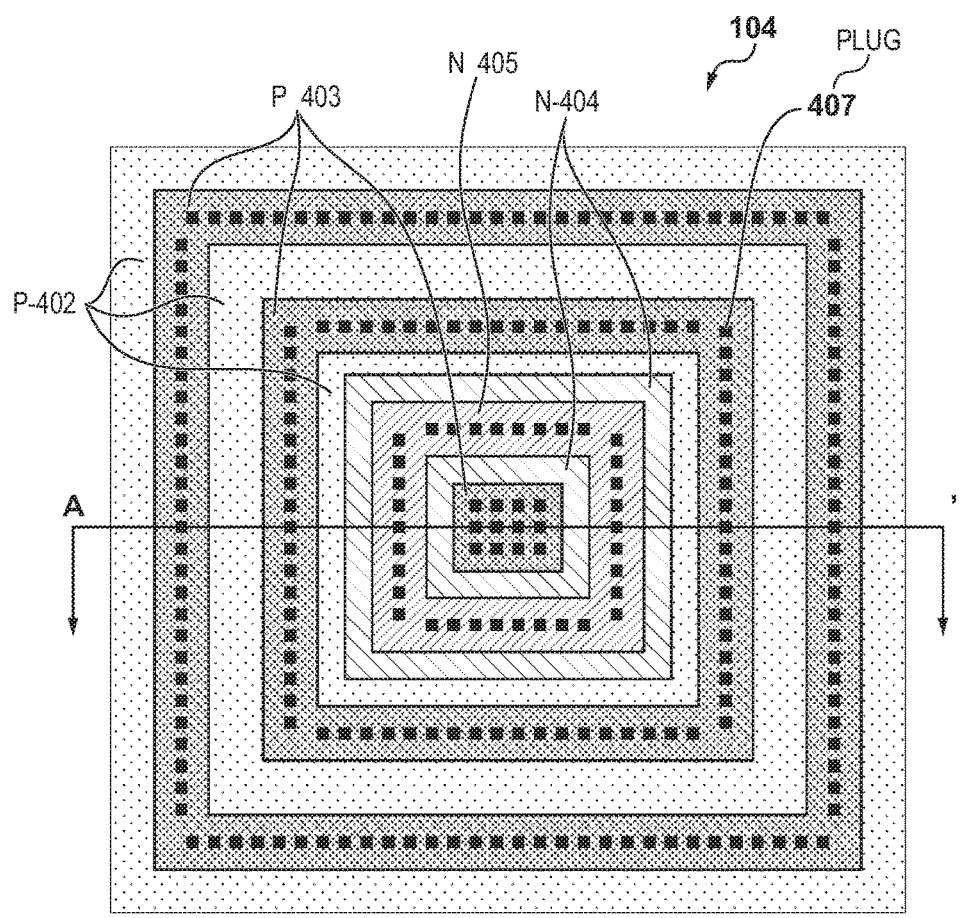

FIG. 1 is a view illustrating an example of a circuit configuration of a printhead substrate according to a first embodiment of the present invention. Also, FIG. 2 is a view illustrating an example of a circuit configuration of a conventional printhead substrate as a comparison target. FIG. 3 is a view for describing a voltage/current waveform in an example of a circuit configuration of a printhead substrate according to the first embodiment of the present invention. Also, FIG. 4 is a view for describing a voltage/current waveform in an example of the circuit configuration of FIG. 2 illustrated as the comparison target. FIGS. 5A and 5B are a plane/cross-sectional view and a connection view of a diode (a temperature detection diode hereinafter) 104-1, 104-2, 104-3 (hereinafter, it is generically indicated as 104) functioning as a sensor for temperature detection according to the first embodiment of the present invention. Hereinafter, description regarding a configuration according to the present embodiment is given using these views.

A printhead substrate 101 and an electronic substrate 121 are electrically connected via a flexible line 120. Here, the electronic substrate 121 is described as something arranged on the side of the printing apparatus body. Also, it is assumed that portions for outputting, to the printhead substrate 101, control signals for controlling various circuits arranged in the printhead substrate 101 and signals corresponding to image data for performing image formation are arranged on the side of the printing apparatus body. Here, a control unit 127 is described as something that outputs various signals to the printhead substrate 101.

Firstly, description regarding an example of a conventional configuration for comparison and the problem to be solved is given using FIG. 2, FIG. 3 and FIG. 4. The printhead substrate 101 heats a heater 102 by a heater current 202 flowing to the heater 102 to cause ink to bubble and discharge. Note, it is assumed that a plurality of heaters for performing image forming are arranged in the printhead substrate 101, although description is given focusing on a configuration for one heater in order to simplify the explanation. In such a case, it is assumed that a plurality of heaters are subject to time-divisional driving at predetermined timings. A VH 110 indicates a power supply for distributing the heater current 202 and supplies a high voltage of approximately 10V to 30V. Paired with this as a negative side, a GNDH 111 is provided as a ground line. A VHT 112 indicates a power supply and supplies a low voltage of approximately 3 to 5 volts, and is used as a driving voltage for a driver transistor 103 or for logic driving. A negative side paired with a ground line, and this ground line is connected to a terminal VSS 205.

For heater driving, conversion by the logic circuit 210 to a heat signal 201 is made based on a signal from the control unit 127 provided on the side of the electronic substrate 121, and the heat signal 201 (FIG. 3) is applied via a buffer 109 to the gate (G) of the driver transistor 103 which is a driving element. The buffer 109 operates as an application circuit of the heat signal 201 with respect to the driver transistor 103. In this case, as illustrated in FIG. 2, a charge current 203 and a sink current 204 flow to the gate capacitance at a time of ON/OFF transitions. At a time of an ON transition, the charge current 203 flows from the VHT 112 to the gate via the buffer 109, and increases its charge. At that time, due to gate capacitance charge transfer, the same current as the charge current 203 flows to the GNDH 111 on the side of the reverse terminal of the capacitance. Similarly, for the sink current 204 at a time of an off transition, current flows from the VH 110 in the path for the terminal VSS 205. The driver transistor 103 and the buffer 109 corresponding to the heater 102 are provided in the printhead substrate 101. A plurality of driver transistors and a plurality of buffers are provided in the printhead substrate 101.

By separately providing a high-voltage power supply system and a low-voltage logic power supply system in the printhead substrate 101, design is such that the influence of heat noise on the logic power supply system is minimized as much as possible. However, for the gate driving current of the driver transistor 103, current comes and goes between the pair of power supplies by way of gate capacitance as described above. As a result, a voltage in a state where influence due to common mode noise as illustrated by a voltage waveform VSS 305 of FIG. 4 is felt is outputted to the side of the electronic substrate 121 connected to the terminal VSS 205. Such noise occurs by high-frequency current such as the charge current 203 and the sink current 204 flowing through the flexible line 120. A noise level is decided mainly in accordance with the number (gate force/sink current value) of the driver transistor 103 driven at the same time and parasitic inductance of the flexible line 120.

A temperature detection diode 104, of which a plurality are provided in the printhead substrate 101, is selected by the MUXs 105 and 106 which function as selection circuits, and an analog voltage dependent on temperature is produced by the DI current 113 flowing. The analog voltage is output from output circuit (the terminal DIK 206 and the terminal DIA_MON 207) to the electronic substrate 121. The plurality of the temperature detection diodes 104 are arranged at different positions in the printhead substrate 101. In other words, the plurality of the temperature detection diodes 104 are arranged so that it is possible to detect the temperature of different positions in the printhead substrate 101. As described above, a control signal from the electronic substrate 121 is inputted to the printhead substrate 101, and selection by the MUXs 105 and 106 is performed based on this control signal. The analog voltage outputted from the printhead substrate 101 is amplified by a signal amplification circuit 124 provided on a side of the electronic substrate 121, digitally converted by an AD converter (hereinafter, ADC) 122 at an arbitrary timing, and temperature data is transferred to a main body ASIC (not shown) that functions as a control unit with respect to the printhead substrate 101. For example, the main body ASIC controls pulse width of the heat signal based on the temperature data. Note that the control unit 127 which outputs various signals includes the main body ASIC (not shown) as a portion thereof. The MUX 106 is connected to an anode terminal (input unit) for current of the temperature detection diode.

As illustrated in FIG. 2 and FIG. 4, with a conventional configuration for comparison, the DI current 113 is inputted from a terminal DIA 208 of the printhead substrate 101 and flows to a terminal DIK 206. There is a design concept to have a configuration where, by separating the terminal DIK 206 and the terminal VSS 205 via a substrate resistance 108, the influence on the terminal DIK 206 side of noise that occurs on the terminal VSS 205 side as described above is minimized as much as possible. However, when the number of temperature detection diodes 104 increases for multi-point temperature detection, the resistance between the terminal DIK 206 and the terminal VSS 205 decreases in accordance with parallelization of the substrate resistance 108. As a result, the sink current 204 takes a roundabout path to the terminal DIK 206 side, and influence of the noise is greatly felt in temperature detection. A high precision temperature is obtained if it is possible to obtain a voltage by the ADC 122 on the electronic substrate 121 side after waiting for the noise to converge, but the throughput is lowered in proportion to the amount of time waited. Meanwhile, if throughput is prioritized, the influence due to the noise described above remains, and detection precision with respect to temperature decreases.

With the circuit configuration according to the present embodiment, as illustrated in FIG. 5B, the temperature detection diode 104 uses a diode connection configuration that shorts a collector 503 and a base 502 of the PNP transistor. A temperature voltage is created across the emitter (E) through the base (B), and a current resulting from amplifying the base current flows across the emitter (E) through the collector (C). In this way, it is possible to have more current flow in the case of a diode connection configuration using a PNP transistor than with a simple PN configuration, and current noise resistance dramatically increases.

FIGS. 5A and 5B illustrate a plane view and a cross-sectional view of the temperature detection diode 104 according to the present embodiment. FIG. 5B is a cross-sectional view of the line A-A' illustrated in FIG. 5A. Each electrode of the PNP transistor is configured from a plug 403 and a high impurity concentration region that has been doped with silicon and has a comparatively low resistance. The p high impurity concentration regions P+ 403 function as electrodes for an emitter 501, the collector 503, and a sub-contact 504, and the n high impurity concentration region N+ 405 functions as an electrode for the base 405. A diode of a PN configuration is formed by a region N− 404 and the region P+ 403 of the emitter 501, and the base 502 is formed as an electrode of the N side. A PNP transistor is formed by the P-type silicon substrate 401 being in contact, and the collector 503 is formed as a P-type electrode. The sub-contact 504 is arranged on a periphery of the collector 503. The sub-contact 504 is typically arranged near the transistor to allow for stable operation of the circuit by dropping the electric potential of the P-type silicon substrate 401 or P− 402 to 0V via a high impurity concentration region P+ 403 and guaranteeing the ground level of the circuit power supply.

As illustrated by FIG. 6 with a conventional configuration for comparison, current that flows out from the emitter 501 flows to the collector 503 (the terminal DIK 206 side). In contrast, in the present embodiment, instead of the collector 503, it flows to the sub-contact 504 via the substrate resistance 108. Consequently, the voltage value at the terminal DIK 206 is set higher than a GND 126 by a fixed voltage. Note that the substrate resistance 108 is a Si substrate resistance having a comparatively low p impurity concentration, and is formed by P− 402 which is configured between the sub-contact 504 and the collector 503 of the PNP transistor. As described above, in general, the sub-contact 504 is used to stabilize the substrate voltage to the GND potential. Therefore, the sub-contact 504 is not used as a current path of the circuit. On the other hand, in the present embodiment, the sub-contact 504 is used as an electrode of the substrate resistance 108 and is used as the current path. Further, in general, the sub contact 504 is used so that P+ 403 is at the GND potential. However, in this embodiment, the potential of P+ 403 and the neighboring P− 402 is set to a voltage higher than the GND potential.

Next, FIG. 1 is used to give a description regarding the first embodiment of the present invention. Details similar to a conventional configuration for comparison are described simply. The plurality of temperature detection diodes 104 each have an anode 505 and a cathode 506 which form a pair. Substrate resistances 108 are connected between the temperature detection diodes 104 and the terminal VSS 205. The cathode 506 of the temperature detection diode 104 is connected to the substrate resistance 108. The MUX 105 selects a connection destination of the terminal DIA 208. In other words, the MUX 105 operates so as to select a supply destination for power from the plurality of the temperature detection diode 104. The MUX 106 selects a connection destination of a terminal DIA_MON 207. A MUX 107 selects a connection destination of the terminal DIK 206. In other words, the MUXs 106 and 107 operate so as to select, from the plurality of the temperature detection diode 104, a temperature detection diode used when detecting a temperature. The anodes 505 of the temperature detection diodes 104 are connected to the MUXs 105 and 106. Consequently, the DI current 113 from a constant current source 123 is selectively supplied to the temperature detection diode 104 by the MUX 105. The electric potential of the anode 505 of the temperature detection diode 104 is selectively outputted to the side of the electronic substrate 121, via the terminal DIA_MON 207, in accordance with the MUX 106. A connecting portion between the substrate resistance 108 and the cathode 506 of the temperature detection diode 104 is connected to the MUX 107. In accordance with selection by the MUX 107, the electric potential of the cathode 506 of the temperature detection diode 104 is outputted to the side of the electronic substrate 121 via the terminal DIK 206. In other words, the DI current 113 flows to the temperature detection diode 104 selected by the MUX 105. Consequently, a potential difference (voltage) between the anode 505 and the cathode 506, which are both terminals of the temperature detection diode 104 selected by the MUX 106 and the MUX 107, is outputted as the potential difference between the terminal DIA_MON 207 and the terminal DIK 206. Note that, in the present embodiment, the MUXs 105, 106, and 107 each perform selection of a connection destination in accordance with a control signal from the control unit 127 which is provided on the side of the electronic substrate 121. Note that, in the present embodiment, description is given assuming that the MUXs 105, 106, and 107 operate in cooperation to select one temperature detection diode 104, but there is no limitation to this configuration. For example, the MUX 105 may operate based on a control signal different to that for the MUXs 106 and 107.

A signal amplification circuit 125 on the electronic substrate 121 of FIG. 1 is a circuit configuration that operates as a differential circuit that takes as an input a potential difference between the voltage outputted from the terminal DIA_MON 207 and the voltage outputted from the terminal DIK 206. Both inputs of the signal amplification circuit 125 which is connected to the terminal DIA_MON 207 and the terminal DIK 206 are in a Hi-Z (high impedance) state. Furthermore, the MUX 107 separates the connection between the cathode terminal of the temperature detection diode 104 and the terminal DIK 206 that is common with the configuration illustrated in FIG. 2, and can selectively connect a line for monitoring voltage to the cathode terminal (an output portion). In other words, the MUX 107 is provided so that a connection with the collector of one respective temperature detection diode 104 can be selected. In other words, the MUX 107 is connected so as to monitor a voltage value at a connecting portion between the cathode terminal of the temperature detection diode 104 and the substrate resistance 108. By configuring in this way, it is possible to set the voltage value from the terminal DIK 206 to be higher than the GND 126 by a fixed voltage, as illustrated in FIG. 3.

When outputting a negative value for the voltage of the terminal DIK 206 due to the influence of noise is envisioned, as in FIG. 4 which illustrates a conventional example for comparison, it is necessary to widen a voltage input range to be negative for a signal amplification circuit. As a consequence, it is necessary to separately provide a negative power supply, or use an amplifier that handles input of a negative voltage. However, with the configuration according to the present embodiment, because the voltage is not outputted as a negative value, it is possible to form the signal amplification circuit 125 by a general-purpose amplifier for a single power supply, and a significant cost reduction is possible.

In addition, there is a method that additionally provides a resistance element between the cathode 506 and the ground on the path of the DI current 113, in order to increase a target voltage by a fixed voltage as described above. However, in the present embodiment, it is possible to realize this without board space for a special resistance element or a resistor, because of the configuration in which current flows to the sub-contact 504 as described above.

As described above using FIG. 3, because both inputs of the signal amplification circuit 125 are in a Hi-Z state, noise that exerts an influence on the voltage waveform VSS 305 is superimposed as is on the voltages of both of the voltage waveform DIA_MON 307 outputted from the terminal DIK_MON 207 and the voltage waveform DIK 306 outputted from the terminal DIK 206. The output of the signal amplification circuit 125 is:

output voltage=(DIA_MON−DIK)×amplification factor.

In other words, the analog temperature voltage for which a noise component is cancelled is outputted to the ADC 122. Thereby, it is possible to realize both of improvement of temperature detection precision and improvement of throughput.

In the present embodiment, description was given for an example where the signal amplification circuit 125, the ADC 122 and the constant current source 123 are provided in the electronic substrate 121. However, there is no limitation to this configuration, and these circuits may be provided in the printhead substrate 101.

Note that, in addition to the embodiment described above, configuration may be taken to have a form in which a digital signal amplification circuit instead of the signal amplification circuit 125 is inputted with digital voltages and outputs a digital temperature voltage for which a noise component is cancelled. For example, an AD converter is provided on the printhead substrate 101. This AD converter is inputted with the analog voltage of the temperature detection diode 104 and converts it to a digital voltage. The AD converter has a configuration for outputting a digital voltage to the terminal DIA_MON 207 or the terminal DIK 206. By such a configuration, the signal amplification circuit 125 is inputted with a digital voltage via the terminal DIA_MON 207 or the terminal DIK 206.

With the example configuration of FIGS. 5A and 5B, there is an arrangement in which the sub-contact 504 surrounds the periphery of the temperature detection diode 104, but the sub-contact 504 may be arranged at a more separated position. For example, by having current flow to a sub-contact of a logic circuit farther away than the temperature detection diode 104 or the like without having the sub-contact 504 in the periphery of the temperature detection diode 104, the value of the substrate resistance increases, and the margin increases for the noise at the terminal DIK. The resistance value greatly changes in accordance with the impurity concentration of P− 402, but the resistance is approximately 200Ω when the sub-contact 504 is separated by approximately 40 um, for example. Consequently, a configuration where the distance between the collector and the sub-contact is 40 um or more, for example, is possible. In the case where the diode current is 0.2 mA, the voltage at the terminal DIK 206 increases by approximately 40 mV, and thus if there is noise whose amplitude is approximately −40 mV, the signal amplification circuit 125 can handle it by a single power supply.

In addition, the resistance corresponding to the substrate resistance 108 is configured by polysilicon or polycrystalline silicon (Poly-Si), and is resistance of the same material as the printing element, Si substrate resistance, or the like.

Second Embodiment

Figure 7A:
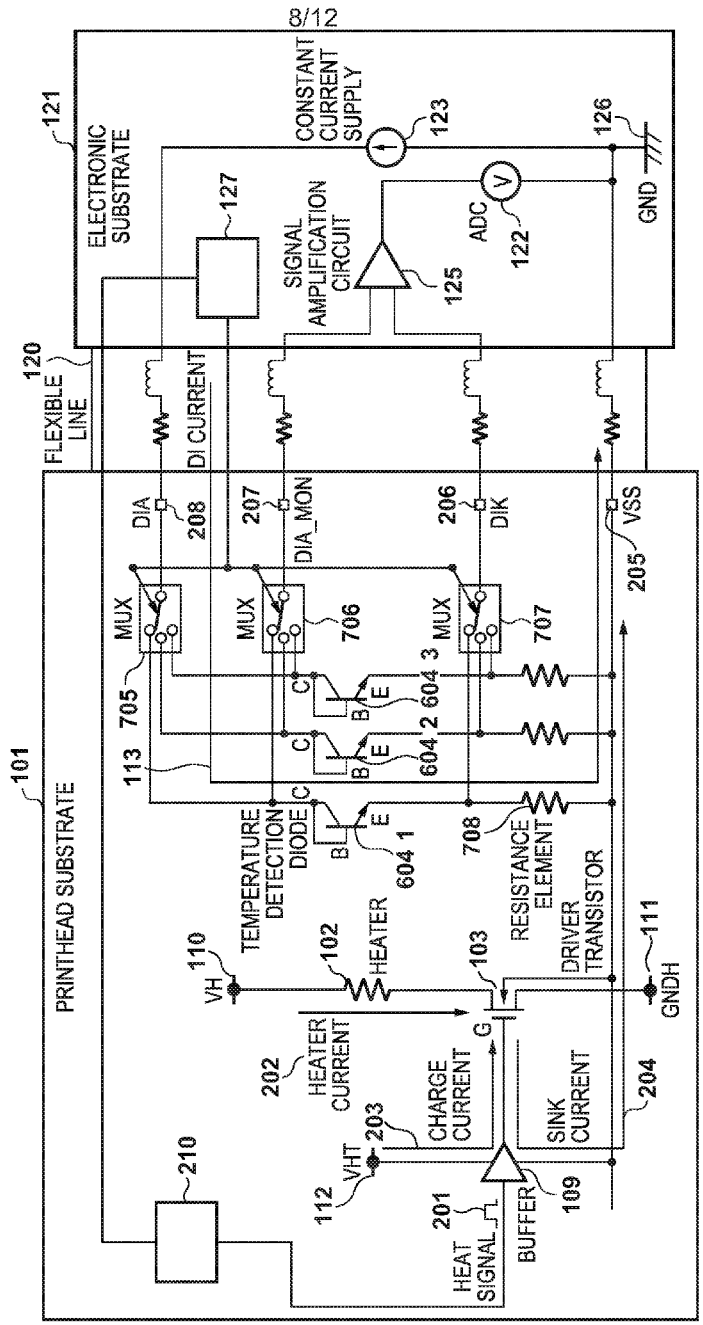
Figure 7B:
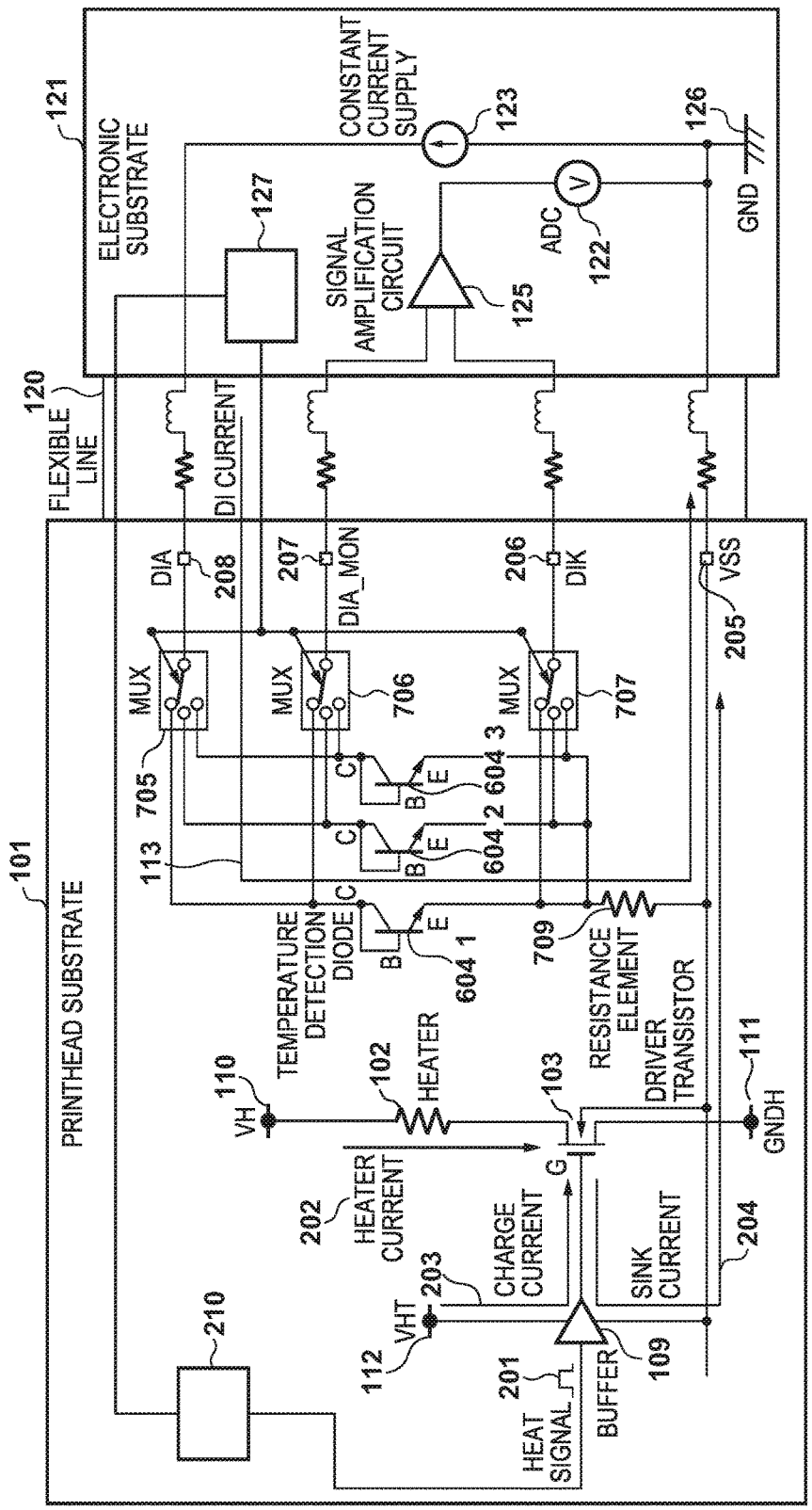
Figure 8A:
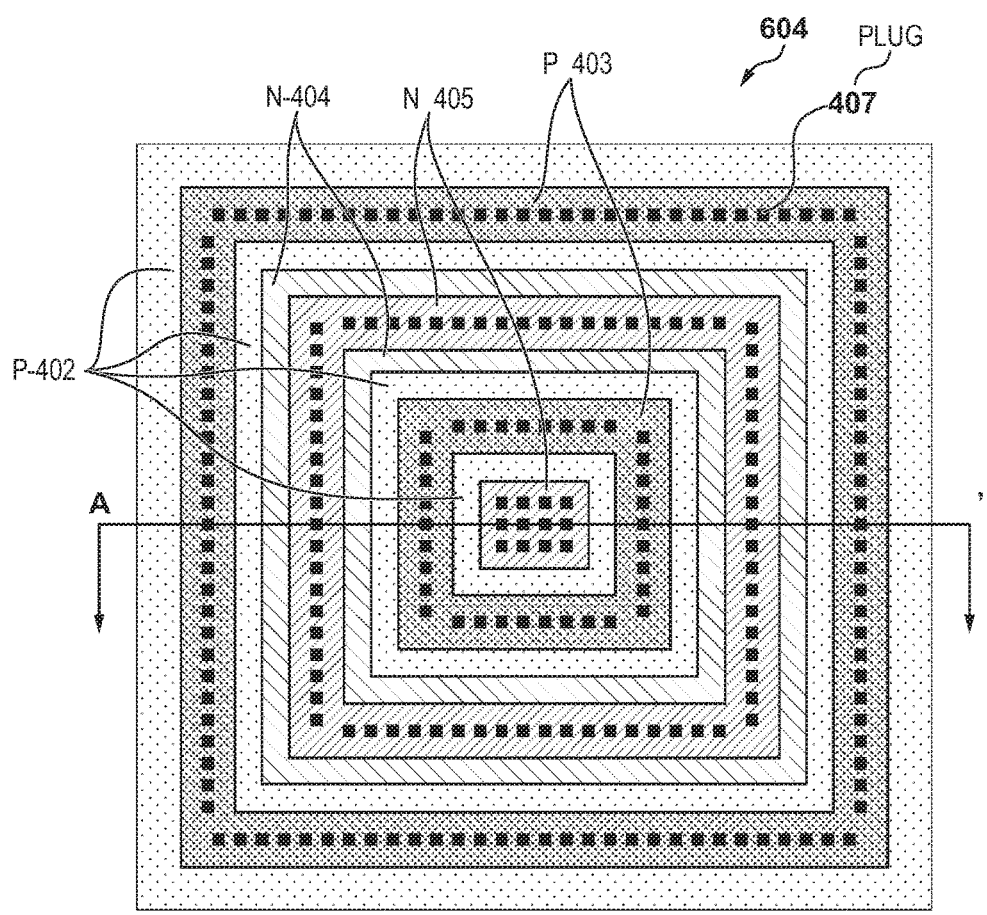
FIGS. 8A and 8B are plane/cross-sectional views of an NPN temperature detection diode according to the second embodiment.
Figure 8B:
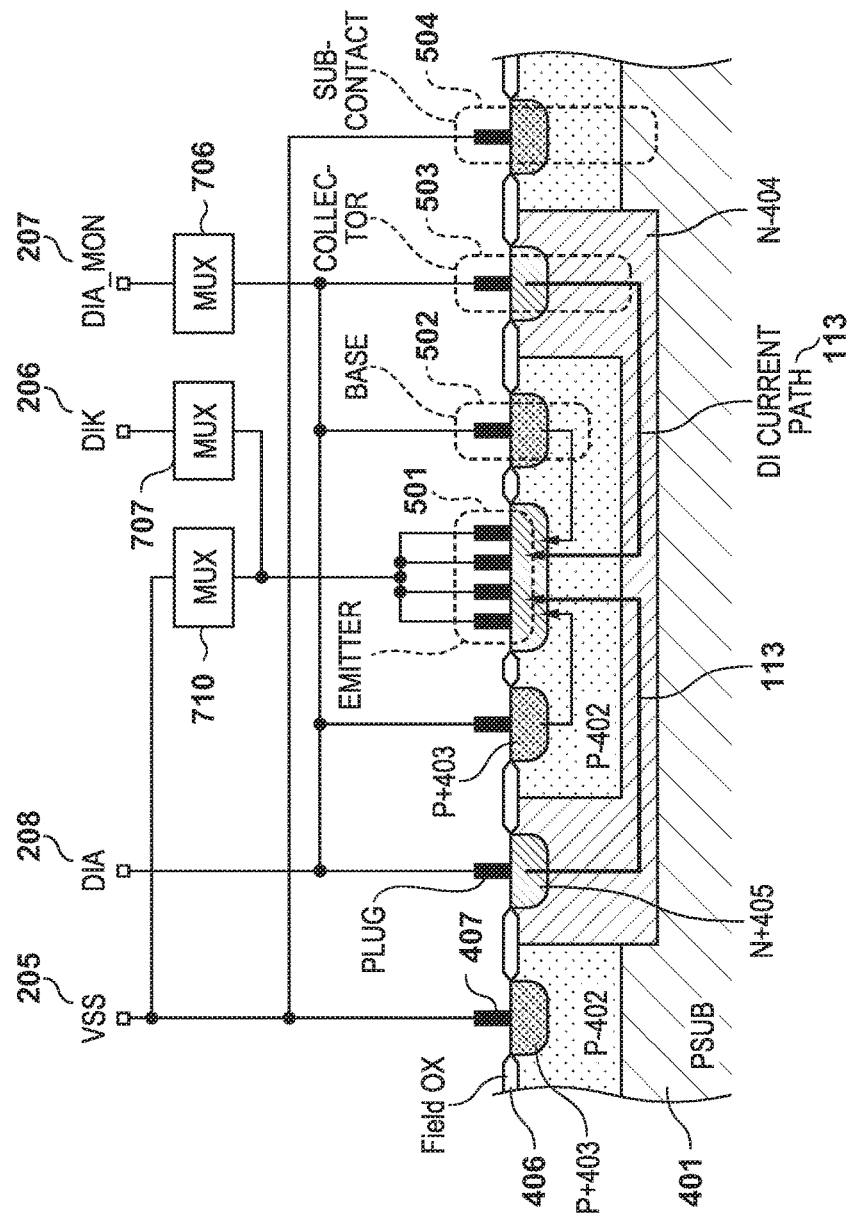

Next, FIG. 7A, FIG. 7B, FIG. 7C, FIG. 8A, and FIG. 8B are used to give a description regarding the second embodiment of the present invention. FIG. 7A through FIG. 7C illustrate examples of configurations of the printhead substrate according to the present embodiment. FIG. 8A and FIG. 8B illustrate a planar layout and a cross-sectional view of a temperature detection diode 604 according to the present embodiment, and these correspond to FIG. 7C. FIG. 8B is a cross-sectional view of the line A-A' illustrated in FIG. 8A.

The temperature detection diode 604 according to the present embodiment is configured by a collector-base short-circuit for an NPN transistor. In FIG. 8A and FIG. 8B, the high impurity concentration regions N+ 405 are electrodes for the emitter 501 and the collector 503, and the high impurity concentration regions P+ 403 are electrodes for the base 502 and the sub-contact 504. In the first embodiment, for the temperature detection diode 104 of FIGS. 5A and 5B, a cathode in a PNP configuration is connected to the terminal VSS 205 via the substrate resistance 108. In contrast, with an NPN configuration according to the present embodiment, N− 404 that has the same electric potential as the collector 503 (is connected thereto) is formed at a deep location so as to enclose an anode P− 402 (connected to the base 502), and a cathode N+ 405 (the emitter 501). Consequently, the anode and the cathode (the emitter 501) are electrically separated from the terminal VSS 205 (the P-type silicon substrate 401 and P− 402).

FIG. 7A is a configuration according to the present embodiment of the temperature detection diode 604-1, 604-2, 604-3 (hereinafter, it is generically indicated as 604) having an NPN configuration, which realizes a cost reduction for the signal amplification circuit 125 by having the electric potential of the terminal DIK 206 be higher than the GND 126, similarly to in the first embodiment. In the first embodiment, a particular resistance element was unnecessary because the substrate resistance 108 is used. In contrast, the configuration illustrated in FIG. 7A is one where resistance elements 708 are additionally used. A configuration where the resistance elements 708 are reduced from those of the configuration illustrated by FIG. 7A is the configuration of FIG. 7B. In the configuration of FIG. 7B, a resistance element 709 is connected in common to the cathodes of a plurality of temperature detection diodes 604. With the configuration of FIG. 7B, it is possible to reduce the number of resistance elements over the configuration of FIG. 7A, and a cost reduction is possible. Similarly to in the first embodiment, with the configuration illustrated by FIG. 7A and FIG. 7B, the MUXs 705, 706, and 707 each perform selection of a connection destination in accordance with a control signal from the control unit 127 which is provided on the side of the electronic substrate 121.

In FIG. 7C, a MUX 710 for current path selection is connected to the cathode side of temperature detection diodes 604. Similarly to in the first embodiment, the MUXs 706, 707 and 710 each perform selection of a connection destination in accordance with a control signal from the control unit 127 which is provided on the side of the electronic substrate 121. Because the MUX 710 has a switch ON resistance, it can serve the role of increasing the cathode voltage the same as the resistance elements 708 and 709 in FIG. 7A and FIG. 7B, by being provided on the cathode side. Resistance elements are unnecessary with this configuration, and even with temperature detection diodes 604 using an NPN transistor, it is possible to realize a cost reduction for the signal amplification circuit 125 and both of an improvement of temperature detection precision and an improvement in throughput, similarly to in the first embodiment.

Note that, with the configuration indicated by the second embodiment, description was given for an example where the signal amplification circuit 125, the ADC 122 and the constant current source 123 are provided in the electronic substrate 121. However, there is no limitation to this configuration, and these circuits may be provided in the printhead substrate 101.

OTHER EMBODIMENTS

The printhead substrate illustrated in the foregoing embodiments may be provided in a scan type printhead, and may be used in a full-line type printhead. In addition, it may be provided in a printing apparatus in which a plurality of printheads are used, and it may be used in a printing apparatus provided with one printhead. In addition, the form of the printhead substrate 101 is not limited to the form as shown in FIG. 1, and other than the heater 102, it may be provided on a substrate or a circuit unit outside the printhead substrate 101. In addition, the recording element is not limited to a heater, and a piezoelectric element or a light emitting element such as an LED may be used.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-126518, filed Jun. 28, 2017, and Japanese Patent Application No. 2018-099798, filed May 24, 2018, which are hereby incorporated by reference herein in their entirety.

What is claimed is:

1. A printing apparatus, comprising:
a printhead substrate comprising a print element;
a driving element for driving the printing element;
an application circuit for applying a driving signal to the driving element;
a ground line connected to the application circuit;
a plurality of temperature sensors configured to detect temperature relate to the printhead substrate, wherein the cathode side of the plurality of temperature sensors connects the ground line via a resistance;
a first selection circuit, on an anode side of the plurality of temperature sensors, configured to select one of the plurality of temperature sensors;
a second selection circuit, on the cathode side of the plurality of temperature sensors, configured to select one of the plurality of temperature sensors; and
a temperature signal output circuit configured to output a temperature signal in accordance with a difference between a voltage of an anode side of the temperature sensor selected by the first selection circuit and a voltage of a cathode side of the temperature sensor selected by the second selection circuit.

2. The printing apparatus according to claim 1, wherein the printing apparatus is provided with a control unit, and the first and second selection circuits perform selections of temperature sensors from the plurality of temperature sensors in accordance with a signal from the control unit.

3. The printing apparatus according to claim 1, further comprising a unit for obtaining a value for temperature based on the temperature signal output circuit.

4. The printing apparatus according to claim 1, wherein a plurality of the printing element are provided in the printhead substrate.

5. The printing apparatus according to claim 1, wherein the temperature signal output circuit comprises a differential circuit.

6. The printing apparatus according to claim 1, wherein a plurality of the resistance are provided in respective correspondence to the plurality of temperature sensors.

7. The printing apparatus according to claim 1, wherein the temperature sensor comprises a diode connection configuration that shorts a collector and a base of a PNP transistor or a diode connection configuration that shorts a collector and a base of an NPN transistor.

8. The printing apparatus according to claim 7, wherein the resistance is a Si substrate resistance configured between a sub-contact and the collector of the PNP transistor.

9. The printing apparatus according to claim 1, wherein the resistance is configured by one of polycrystalline silicon, a resistance of the same material as the printing element, and a Si substrate resistance.

10. A printhead substrate, comprising:
a printing element;
a driving element for driving the printing element;
an application circuit for applying a driving signal to the driving element;
a ground line connected to the application circuit;
a plurality of temperature sensors arranged in the printhead substrate, wherein a cathode side of the plurality of temperature sensors connects the ground line via a resistance;

a first selection circuit, on an anode side of the plurality of temperature sensors, configured to select one of the plurality of temperature sensors;

a second selection circuit, on a cathode side of the plurality of temperature sensors, configured to select one of the plurality of temperature sensors; and an output circuit configured to output a voltage of an anode side of temperature sensor selected by the first selection circuit and a voltage of a cathode side of temperature sensor selected by the second selection circuit.

11. The printhead substrate according to claim 10, wherein the first and second selection circuits perform selection of temperature sensors to cause to perform temperature detection from the plurality of temperature sensors in accordance with an external signal.

12. The printhead substrate according to claim 10, further comprising a third selection circuit, provided between a supply source of power and an anode side of a plurality of temperature sensors, configured to select a temperature sensor for a supply destination of power.

13. The printhead substrate according to claim 10, wherein the resistance is configured by a third selection circuit for switching a connection between the ground line and one of the plurality of temperature sensors.

14. The printhead substrate according to claim 10, wherein a plurality of the resistance are provided in respective correspondence to the plurality of temperature sensors.

15. The printhead substrate according to claim 10, wherein the temperature sensor comprises a diode connection configuration that shorts a collector and a base of a PNP transistor or a diode connection configuration that shorts a collector and a base of an NPN transistor.

16. The printhead substrate according to claim 15, wherein the resistance is a Si substrate resistance configured between a sub-contact and the collector of the PNP transistor.

17. The printhead substrate according to claim 10, wherein the resistance is configured by one of polycrystalline silicon, a resistance of the same material as the printing element, and a Si substrate resistance.

18. The printhead substrate according to claim 10, wherein a plurality of the printing element are provided in the printhead substrate.

* * * * *